(12) United States Patent
Schmidgall et al.

(10) Patent No.: US 11,090,750 B2
(45) Date of Patent: Aug. 17, 2021

(54) METHOD FOR PRODUCING A COOLING DEVICE, A COOLING DEVICE AND A COOLING ARRANGEMENT

(71) Applicant: Mahle International GmbH, Stuttgart (DE)

(72) Inventors: Stefan Schmidgall, Stuttgart (DE); Matthias Tuerpe, Marbach a. N. (DE)

(73) Assignee: Mahle International GmbH

( * ) Notice: Subject to any disclaimer, the term of this patent is extended or adjusted under 35 U.S.C. 154(b) by 447 days.

(21) Appl. No.: 15/945,519

(22) Filed: Apr. 4, 2018

(65) Prior Publication Data
US 2018/0290224 A1 Oct. 11, 2018

(30) Foreign Application Priority Data

Apr. 5, 2017 (DE) .......................... 102017205813.7

(51) Int. Cl.
| | |
|---|---|
| *F28F 13/12* | (2006.01) |
| *B23K 1/00* | (2006.01) |
| *B23K 35/30* | (2006.01) |
| *F28F 21/08* | (2006.01) |
| *F28F 21/04* | (2006.01) |
| *H05K 7/20* | (2006.01) |
| *B23K 103/10* | (2006.01) |
| *B23K 103/00* | (2006.01) |

(52) U.S. Cl.
CPC .......... *B23K 1/0012* (2013.01); *B23K 1/0006* (2013.01); *B23K 35/302* (2013.01); *F28F 13/12* (2013.01); *F28F 21/04* (2013.01); *F28F 21/084* (2013.01); *H05K 7/209* (2013.01); *H05K 7/20927* (2013.01); *B23K 2103/10* (2018.08); *B23K 2103/52* (2018.08)

(58) Field of Classification Search
CPC ..................................................... B23K 1/0012
USPC ........................................................ 174/254
See application file for complete search history.

(56) References Cited

U.S. PATENT DOCUMENTS

| | | | | |
|---|---|---|---|---|
| 4,795,160 | A | * | 1/1989 | Sterling .................... A63F 1/04 273/269 |
| 4,832,988 | A | * | 5/1989 | Bogenschutz ......... H05K 3/381 205/122 |
| 5,926,371 | A | * | 7/1999 | Dolbear .............. H01L 23/4006 174/138 G |

(Continued)

FOREIGN PATENT DOCUMENTS

| | | |
|---|---|---|
| DE | 10062108 A1 | 6/2002 |
| DE | 102013203232 A1 | 9/2013 |
| EP | 3136431 A1 | 3/2017 |

*Primary Examiner* — Stanley Tso
(74) *Attorney, Agent, or Firm* — Fishman Stewart PLLC

(57) ABSTRACT

A method for producing a cooling device for cooling a power electronics may include an application step, a preparatory step, and a joining step. The application step may include applying a thin copper layer at least area by area onto a joining side of at least one ceramic plate. The preparatory step may include arranging the at least one ceramic plate with the thin copper layer on at least one of a first upper side of a substantially flat aluminum body and a second upper side of the aluminum body disposed opposite the first upper side. The joining step may include forming a substance-to-substance bond between the joining side of the at least one ceramic plate and the aluminum body via supplying heat.

17 Claims, 3 Drawing Sheets

(56) References Cited

U.S. PATENT DOCUMENTS

| | | | |
|---|---|---|---|
| 6,812,559 B2 | 11/2004 | Palm et al. | |
| 8,967,453 B2 | 3/2015 | Le et al. | |
| 9,786,577 B2* | 10/2017 | Terasaki | H01L 31/04 |
| 2003/0066828 A1* | 4/2003 | Boardman | C23C 8/80 |
| | | | 219/543 |
| 2005/0181199 A1* | 8/2005 | Shah | B23K 35/3006 |
| | | | 428/323 |
| 2006/0060328 A1* | 3/2006 | Ewes | H01L 23/427 |
| | | | 165/80.2 |
| 2010/0012488 A1* | 1/2010 | Koenigsmann | B23K 1/0016 |
| | | | 204/298.13 |
| 2010/0295172 A1* | 11/2010 | Gao | H01L 23/427 |
| | | | 257/712 |
| 2011/0096506 A1* | 4/2011 | Huang | H01L 25/0657 |
| | | | 361/707 |
| 2011/0235279 A1* | 9/2011 | Mori | H01L 23/473 |
| | | | 361/717 |
| 2012/0007117 A1* | 1/2012 | Andrews | H01L 24/14 |
| | | | 257/98 |
| 2014/0318831 A1* | 10/2014 | Nishikawa | C04B 35/632 |
| | | | 174/252 |
| 2015/0198372 A1* | 7/2015 | Desikan | H01F 27/105 |
| | | | 165/151 |
| 2015/0257280 A1* | 9/2015 | Ciliox | B23K 35/0238 |
| | | | 228/122.1 |
| 2016/0016245 A1* | 1/2016 | Terasaki | B23K 1/0016 |
| | | | 228/123.1 |
| 2016/0218482 A1* | 7/2016 | Tayebati | H01S 5/02272 |
| 2016/0219693 A1* | 7/2016 | Nishimoto | H05K 3/465 |
| 2017/0025334 A1* | 1/2017 | van Gemert | H01L 21/4882 |
| 2018/0255646 A1* | 9/2018 | Moriyama | H05K 3/0061 |
| 2018/0283802 A1* | 10/2018 | Bungo | H01L 23/473 |
| 2020/0027815 A1* | 1/2020 | Yumoto | H01L 23/36 |

* cited by examiner

METHOD FOR PRODUCING A COOLING DEVICE, A COOLING DEVICE AND A COOLING ARRANGEMENT

CROSS-REFERENCE TO RELATED APPLICATIONS

This application claims priority to German Patent Application No. DE 10 2017 205 813.7, filed on Apr. 5, 2017, the contents of which are hereby incorporated by reference in its entirety.

TECHNICAL FIELD

The invention relates to a method for producing a cooling device for cooling a power electronics. The invention also relates to a cooling device. Finally, the invention relates to a cooling arrangement comprising at least two cooling devices for cooling a power electronics.

BACKGROUND

A power electronics is typically arranged, in particular in a motor vehicle, on a ceramic plate, the so-called DCB substrate (direct copper bonded substrate), which is copper-plated on both sides or on one side. A structured copper layer on one of the sides of the ceramic plate thereby electrically connects individual components of the power electronics to one another. To avoid an overheating of the individual components of the power electronics and to thus increase the service life of the power electronics, the heat generated during the operation of the power electronics can be dissipated, for example via a cooling body. For an improved heat dissipation, the DCB substrate comprising the power electronics is then arranged over a large area on the cooling body with a side, which faces away from the power electronics, so that the cooling body can absorb the heat generated by the power electronics and can discharge the heat into the environment by means of convection or by means of radiation. Due to a suitable heat conductivity, copper bodies are basically being used recently as a result of comparatively low costs.

To achieve that the common DCB substrate abuts on the aluminum body across a large area, the copper-plated or non-copper-plated ceramic plate needs to be connected to the aluminum body by means of a substance-to-substance bond. On principle, a solder connection is possible here. Due to the fact, however, that a direct solder connection of the mentioned materials can only be realized with difficulties, further connecting methods need to be employed. For example, a nickel plate can thus be used, which is first soldered to the aluminum body and then to the copper-plated or non-copper-plated ceramic plate. This connecting method, however, is time-consuming as well as costly.

SUMMARY

It is thus the object of the invention to provide a method, in which the ceramic plate can be connected to the aluminum body by means of a substance-to-substance bond in a time-saving and effort-reduced manner. It is a further object of the invention to provide a cooling device and a cooling arrangement comprising at least two cooling devices, which can be produced in a cost-efficient manner and which provide for an efficient cooling of the power electronics.

According to the invention, this object is solved by means of the subject matter of the independent claims. Advantageous embodiments are the subject matter of the dependent claims.

The present invention is based on the surprising knowledge that an establishing of a direct substance-to-substance bond between a ceramic plate and an aluminum body depends on a layer thickness of a copper layer, which is applied onto the ceramic plate. In the method according to the invention, a thin copper layer is thus first applied at least area by area onto a joining side of at least one ceramic plate in an application step. The thin copper layer is thereby defined as a layer of between 20 µm and 200 µm, preferably between 35 µm and 100 µm. At least one ceramic plate is subsequently arranged with the thin copper layer on a first upper side of a flat aluminum body in a preparatory step. In the alternative, at least one ceramic plate can in each case be arranged on the first upper side and on a second upper side, which is located opposite the first upper side, of the flat aluminum body. The joining side of the respective ceramic plate is subsequently connected to the respective upper side of the aluminum body by means of a substance-to-substance bond by supplying heat in a joining step.

The ceramic plate is electrically insulating and can consist for example of $Al_2O_3$. $Al_2O_3$ is a cost-efficient ceramic and the production costs of the ceramic plate as well as of the cooling device as a whole can be reduced in an advantageous manner. The aluminum body can consist of aluminum as well as of an aluminum alloy to further reduce the production costs of the cooling device. The aluminum body can thereby be a full body or particularly preferably a flat aluminum tube. The flat aluminum tube has a flat cross section and a coolant can flow through it in its longitudinal direction. The power electronics can be cooled more efficiently by means of a heat transfer between the coolant and the aluminum tube comprising the ceramic plate, which is arranged on the aluminum tube. The cooling can be further improved by means of a rib structure arranged within the aluminum tube.

According to the invention, the thin copper layer is applied at least area by area to the joining side of the ceramic plate in the application step. An application of the thin copper layer can thereby occur for example by means of a direct copper bonding or by means of a thermal spraying or by means of a wet-chemical coating or galvanically. In the case of the thermal spraying, the joining side of the ceramic plate is initially roughened for example wet-chemically or by means of laser ablation and is subsequently coated with the copper. In response to the wet-chemical coating, the joining side of the ceramic plate is also initially roughened and is subsequently copper-plated.

In the alternative, the thin copper layer can be produced for example using screen printing. The required layer thickness of the thin copper layer of between 20 µm and 200 µm, preferably of between 35 µm and 100 µm, can be reached in a simple way by means of the mentioned coating methods.

According to the invention, the thin copper layer can be applied onto the joining side across a large area or area by area. In the case of the thin cover layer, which covers the joining side area by area, said thin copper layer can initially be applied across a large area and can subsequently be structured by means of an abrasion. A structuring can also already be produced during a coating process by means of a suitable form.

Advantageously, a copper structure for contacting the power electronics can also be applied onto an electronics side of the ceramic plate, which is located opposite the joining side. The copper-coating of the ceramic plate on the joining side and on the electronics side can occur separately from one another as well as simultaneously. The layer thicknesses of the copper-coating can differ on the joining side and on the electronics side, so as to facilitate a direct arranging of the joining side onto the aluminum body by means of a substance-to-substance bond on the one hand, and so as to provide for a safe contacting of the power electronics on the other hand. Thermal stresses in the ceramic plate, which are caused by different heat expansion coefficients, can also be reduced by means of a bilateral copper-plating of the ceramic plate. Moreover, a bilaterally copper-coated ceramic plate can be produced in a cost-efficient manner.

After the application step, at least one ceramic plate comprising the thin copper layer is arranged on the first upper side of the aluminum body in the preparatory step. In the joining step, the joining side of the ceramic plate is subsequently connected to the upper side of the aluminum body by means of a substance-to-substance bond by supplying heat. In the alternative, at least one ceramic plate can in each case be arranged on the first upper side of the flat aluminum body and on the second upper side and can simultaneously be connected to the aluminum body by means of a substance-to-substance bond in the joining step. Due to the thin copper layer, the respective joining side can be directly connected to the respective upper side of the aluminum body by means of a substance-to-substance bond in a time-saving and effort-reduced manner for example by means of a direct soldering or by means of a sintering.

Provision is advantageously made for a solder coating to be applied onto the respective upper side of the aluminum body and/or onto the respective joining side of the ceramic plate at least area by area in the preparatory step. In the joining step, the respective joining side of the ceramic plate is then connected to the respective upper side of the aluminum body by means of a substance-to-substance bond by means of a soldering. Due to the solder coating, the soldering is simplified in an advantageous manner and the method can be carried out more quickly.

The solder coating is preferably an aluminum solder coating and/or a silicon solder coating and/or a copper solder coating and/or a nickel solder coating. The solder coating can be applied onto the joining side of the ceramic plate as well as onto the respective upper side of the aluminum body. An application of the solder coating can thereby occur for example by means of a thermal spraying or by means of a wet-chemical coating or in a galvanic manner. Due to the solder coating, the quality of the solder connection can additionally also be improved in an advantageous manner.

To further improve the quality of the solder connection, provision is advantageously made for a flux to be applied onto the respective upper side of the aluminum body and/or onto the respective joining side of the ceramic plate at least area by area in the preparatory step. The wetting of the solder coating on the joining side of the ceramic plate or on the respective upper side of the aluminum body is improved by means of the flux and the quality of the applied solder coating and thus of the solder connection is improved in this way.

In the alternative, provision is made for a sinter coating to be applied onto the respective upper side of the aluminum body and/or onto the respective joining side of the ceramic plate at least area by area in the preparatory step. In the joining step, the respective joining side is then connected to the respective upper side of the aluminum body by means of a substance-to-substance bond by means of a sintering. The sinter coating is preferably an aluminum sinter coating and/or a silicon sinter coating and/or a copper sinter coating and/or a nickel sinter coating. The sinter coating can also consist of a mixture of a plurality of sinter coatings, so as to improve for example the quality of the sintered connection. The size of particles to be sintered in the sinter coating can thereby be adapted in such a way that the quality of the sintered connection is improved, or that the sintering temperature is reduced.

Provision is advantageously made for an exothermic joining coating to be arranged on the respective upper side of the aluminum body and/or on the respective joining side of the ceramic plate at least area by area in the preparatory step. In the joining step, the respective joining side of the ceramic plate is then connected to the respective upper side of the aluminum body by means of a substance-to-substance bond by means of an exothermic soldering. The heat supply can in particular be improved in the layers to be joined on the ceramic plate and on the aluminum body in this way, so that the joining occurs uniformly within the layers to be joined and the quality of the solder connection or of the sintered connection is thus improved.

The exothermic joining coating can preferably be a joining film, which can be arranged between the ceramic plate and the aluminum body in a simple way.

Provision is made for the joining step to be performed at a temperature of between 200° C. and 600° C. The temperature in the joining step can thereby depend on the used solder coating, on the used flux, on the used sinter coating, or on the used joining coating. In the case of a suitable selection of these parameters, the temperature in the joining step as well as the energy consumption can be reduced and the production costs for the cooling device can be lowered in an advantageous manner.

To avoid a distortion of the ceramic plate and of the aluminum body in the joining step, provision is advantageously made for the aluminum body to be clamped to the ceramic plate. A distortion of the aluminum body and of the ceramic plates caused as a result of a thermal expansion can thus be avoided and the service life of the cooling device as well as of the power electronics, which is arranged on the ceramic plate, can be increased.

Provision is advantageously made for a solder coating to be applied onto the inner sides of the aluminum body in the form of an aluminum tube in the preparatory step and for a rib structure to be arranged in the aluminum tube by means of a substance-to-substance bond in the joining step. The rib structure can also be made of aluminum or of an aluminum alloy and can be arranged in the aluminum tube for example by means of a hard soldering. The hard soldering is defined here as a soldering at a temperature of above 450° C. On principle, the arranging of the ceramic plate on the aluminum tube by means of a substance-to-substance bond can be carried out simultaneously with the hard soldering between the rib structure and the aluminum tube, as soon as the temperature used for arranging the ceramic plate on the aluminum tube also allows for the hard soldering of the rib structure with the aluminum tube.

To avoid a distortion of the aluminum body, provision is made for the respective ceramic plates to be arranged on the respective upper sides of the aluminum body so as to be located opposite one another in the preparatory step and for the respective ceramic plates to be arranged on the respective upper sides so as to be located opposite one another by means of a substance-to-substance bond in the joining step. By arranging the ceramic plates on the aluminum body in such a way, thermal expansions and tensions in the aluminum body and in the ceramic plates, which are caused by the thermal expansions, can balance each other. The service life of the ceramic plates and in particular of the power electronics can be increased in this way. If the ceramic plates, which are located opposite one another, are simultaneously arranged on the aluminum body in the joining step, expansions, which occur during the joining step as a result of the heat supply, can also be compensated in an advantageous manner.

In the alternative, provision is made for the respective ceramic plates to be arranged offset relative to one another on the respective upper sides of the aluminum body in the preparatory step and for the respective ceramic plates to be arranged offset relative to one another on the respective upper sides by means of a substance-to-substance bond in the joining step. Thermal expansions and tensions in the aluminum body and in the ceramic plates, which are caused by the thermal expansions, can also be compensated in an advantageous manner here.

After the joining step, provision is advantageously made for the power electronics to be arranged on an electronics side, which is located opposite the joining side and which has a copper structure, of at least one of the respective ceramic plates by means of a substance-to-substance bond in a production step. The power electronics thereby comprises a plurality of individual components, which are arranged on the ceramic plate by means of a substance-to-substance bond. To connect the individual components to one another in an electrically conductive manner, the copper structure on the electronics side of the ceramic plate has for example a conductor track structure, on which the individual components of the power electronics are arranged. The power electronics is preferably arranged by means of a soft soldering thus by means of a soldering at a temperature of below 450° C.

The invention also relates to a cooling device for cooling a power electronics, which is produced according to above-described methods. At least one ceramic plate is thereby arranged with a joining side on a first upper side, or at least one ceramic plate is in each case arranged on the first upper side and on a second upper side, which is located opposite the first upper side, of an aluminum tube by means of a substance-to-substance bond by means of the above-described method. The cooling device thus has at least one ceramic plate, which is arranged with a joining side on a first upper side of an aluminum tube by means of a substance-to-substance bond. The power electronics is arranged on an electronics side, which is located opposite the joining side, of at least one of the respective ceramic plates by means of a substance-to-substance bond. In the alternative, at least one ceramic plate can in each case be arranged on the first upper side and on a second upper side, which is located opposite the first upper side, of an aluminum tube.

The flat aluminum tube thereby has a flat cross section and a coolant can flow through it in its longitudinal direction. A heat transfer takes place between the coolant and the aluminum tube comprising the ceramic plate, which is arranged on the aluminum tube, and the power electronics can be cooled more efficiently. To improve the cooling, the aluminum tube can have a rib structure on the inner side. The ceramic plates can be arranged on the aluminum tube on the first upper side and on the second upper side, so that thermal expansions and tensions in the aluminum tube and in the ceramic plates, which are caused by the thermal expansions, can be balanced with respect to one another. The service life of the ceramic plates and in particular of the power electronics can thus be increased. The ceramic plates can be arranged on the aluminum tube so as to be located opposite one another or so as to be offset relative to one another.

The invention also relates to a cooling arrangement for cooling a power electronics, wherein the cooling arrangement has at least one above-described cooling device in each case comprising an aluminum tube. The cooling arrangement thereby has at least two coolant collectors for collecting a coolant, which flows through the respective aluminum tubes, wherein the respective aluminum tubes lead into the coolant collectors on both sides. The coolant such as water, for example can flow through the coolant arrangement, so that a cooling of the power electronics can be carried out particularly efficiently. The cooling arrangement can have a plurality of cooling devices, which are arranged spaced apart from one another or next to one another. The respective aluminum tubes lead into the coolant collectors, so that the coolant can flow through the cooling devices and the power electronics can be cooled efficiently.

Further important features and advantages of the invention follow from the subclaims, from the drawings, and from the corresponding figure description by means of the drawings.

It goes without saying that the above-mentioned features and the features, which will be described below, cannot only be used in the respective specified combination, but also in other combinations or alone, without leaving the scope of the present invention.

Preferred exemplary embodiments of the invention are illustrated in the drawings and will be described in more detail in the description below, whereby identical reference numerals refer to identical or similar or functionally identical components.

BRIEF DESCRIPTION OF THE DRAWINGS

In each case schematically.

DETAILED DESCRIPTION

Figure 1:
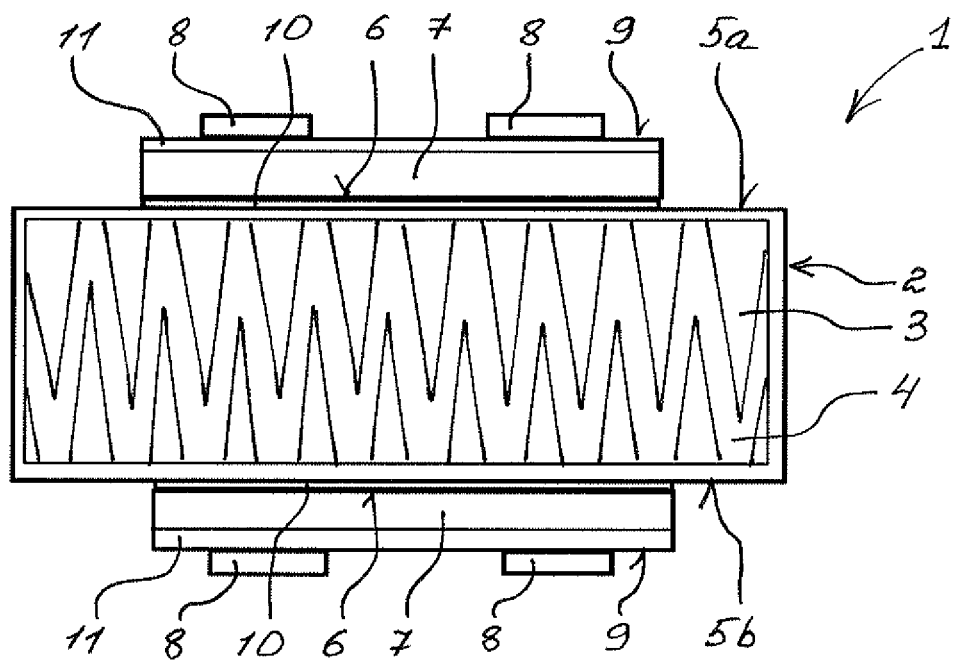
FIG. 1 shows a side view of a cooling device comprising an aluminum tube and comprising ceramic plates located opposite one another.

FIG. 1 shows a side view of a cooling device 1. The cooling device 1 has an aluminum body 2 in the form of an aluminum tube 3 comprising a rib structure 4. The aluminum tube 3 as well as the rib structure 4 can be made of aluminum or of an aluminum alloy. The rib structure 4 can be arranged in the aluminum tube 3 for example by means of a hard soldering, or, in the alternative, the aluminum tube 3 can be made in one piece with the rib structure 4, for example in an extrusion process. The flat aluminum tube 3 has a flat cross section and a coolant such as water, for example can flow through it in its longitudinal direction along the rib structure 4.

The cooling device 1 furthermore has a ceramic plate 7, which is arranged on a first upper side 5a of the aluminum tube 3 with a joining side 6 by means of a substance-to-substance bond by means of a method according to the invention, and which is equipped with a power electronics 8 on an electronics side 9 located opposite the joining side 6. The ceramic plate 7 is electrically insulating and can consist for example of $Al_2O_3$. A heat transfer occurs between the coolant in the aluminum tube 3 and the ceramic plate 7, which is arranged on the aluminum tube 3, and the power electronics 8 can be cooled more efficiently. The cooling is additionally supported by the rib structure 4 of the aluminum tube 3.

On a second upper side 5b of the aluminum tube 3, the cooling device 1 has a further ceramic plate 7. The ceramic plates 7 are arranged on the aluminum tube 3 on the first upper side 5a and on the second upper side 5b so as to be located opposite one another, so that thermal expansions and tensions in the aluminum tube 3 and in the ceramic plates 7, which are caused by the thermal expansions, balance each other. The service life of the ceramic plates 7 and in particular of the power electronics 8 is thus increased.

A direct arranging of the ceramic plates 7 on the aluminum tube 3 by means of a substance-to-substance bond is possible by means of a thin copper layer 10, which has a layer thickness of between 20 μm and 200 μm, preferably of between 35 μm and 100 μm. On the electronics side 9, the ceramic plates 7 additionally have a copper structure 11 for contacting individual components of the power electronics 8. The layer thicknesses of the thin copper layer 10 and of the copper structure 11 can differ in order to provide for a direct arranging of the ceramic plate 7 on the aluminum tube 3 by means of a substance-to-substance bond on the one hand and in order to provide for a safe contacting of the individual components of the power electronics 8 on the other hand.

Figure 2:
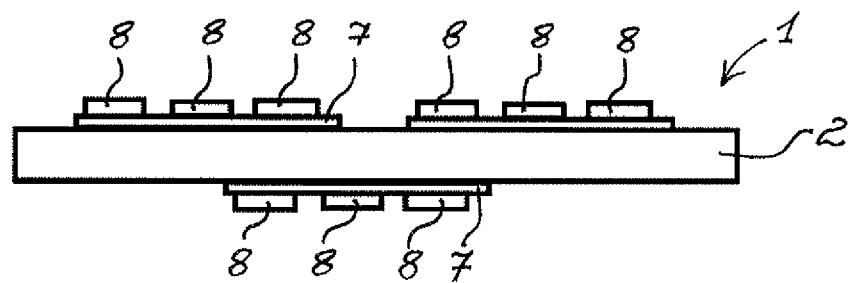
FIG. 2 shows a side view of a cooling device comprising a plurality of ceramic plates, which are arranged offset relative to one another.
Figure 3:
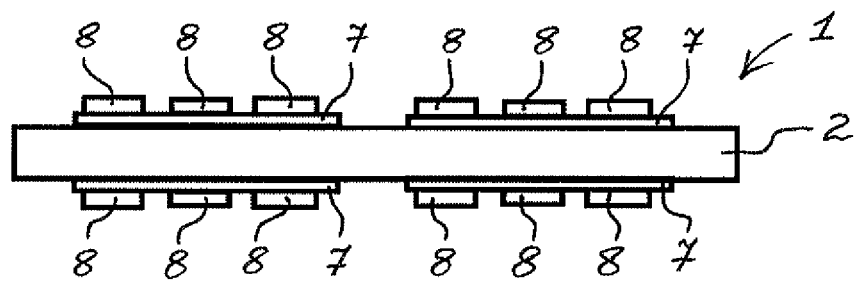
FIG. 3 shows a side view of a cooling device comprising a plurality of ceramic plates located opposite one another.

FIG. 2 shows a side view of the cooling device 1 comprising the ceramic plates 7, which are arranged offset relative to one another and FIG. 3 shows a side view of the cooling device 1 comprising the ceramic plates 7 located opposite one another. By arranging the ceramic plates 7 on the aluminum body 2 in this way, thermal expansions and tensions in the aluminum body 3 and in the ceramic plates 7, which are caused by the thermal expansions, can balance each other and the service life of the ceramic plates 7 and in particular of the power electronics 8 can be increased. If the ceramic plates 7 are also arranged on the aluminum body 2 at the same time, expansions, which occur as a result of the heat supply during the arranging, can also be compensated in an advantageous manner.

Figure 4:
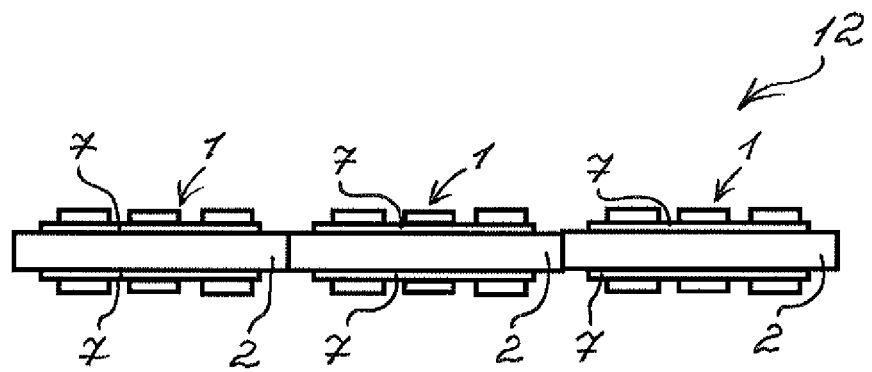
FIG. 4 shows a side view of a cooling arrangement comprising three cooling devices located opposite one another.
Figure 5:
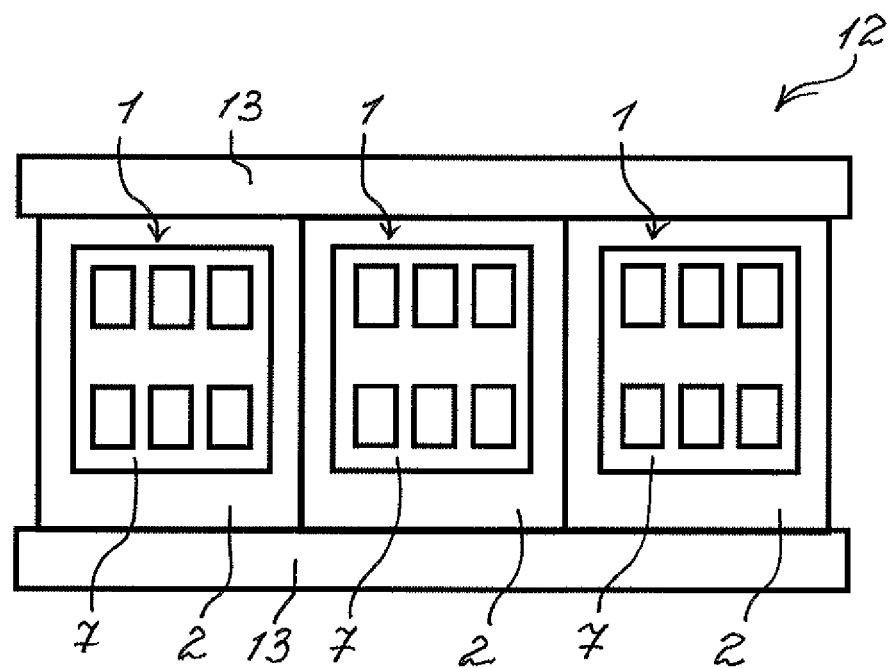
FIG. 5 shows a top view onto the cooling arrangement shown in FIG. 4 comprising three cooling devices arranged next to one another.
Figure 6:
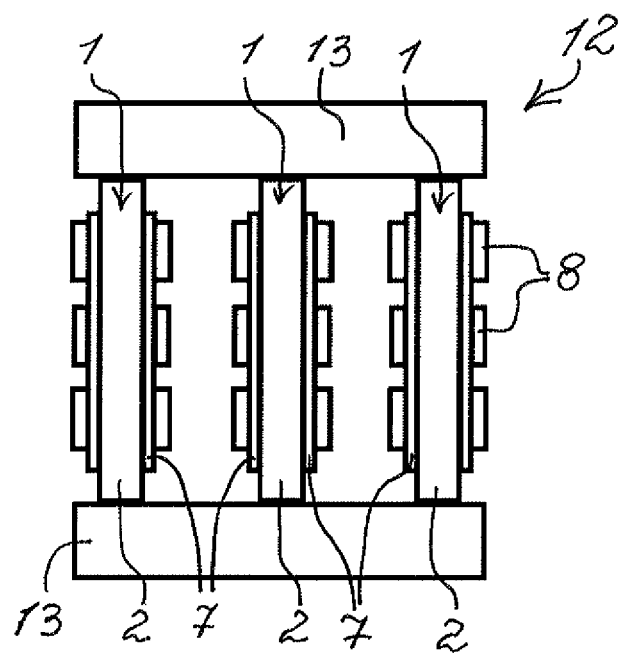
FIG. 6 shows a side view of a cooling arrangement, which is embodied in an alternative manner, comprising three cooling devices.

FIG. 4 shows a side view and FIG. 5 shows a top view onto a cooling arrangement 12 comprising three cooling devices 1. The cooling devices 1 are arranged next to one another and the aluminum tubes 3 of the respective cooling devices 1 discharge into coolant collectors 13 on both sides. Due to the coolant collectors 13, the coolant can flow through the respective aluminum tubes 3, so that a cooling of the power electronics 8 can be carried out particularly efficiently. FIG. 6 shows a side view of an alternatively embodied cooling arrangement 12 comprising three cooling devices 1, which are arranged spaced apart from one another. The aluminum tubes 3 also lead into the coolant collector 13 on both sides here.

Figure 7:
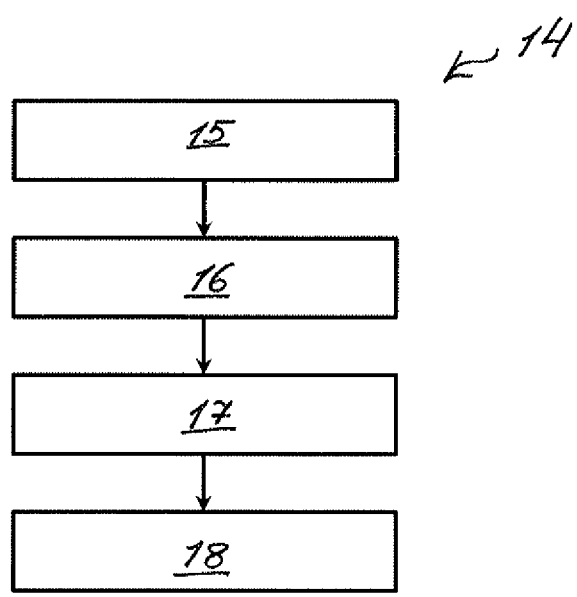
FIG. 7 shows a course of a method according to the invention.

FIG. 7 shows a schematic course of a method 14 according to the invention. In the method 14, the thin copper layer 10 is first applied onto the joining side 6 of the ceramic plate 7 at least area by area in an application step 15. The thin copper layer 10 thereby has a layer thickness of between 20 μm and 200 μm, preferably of between 35 μm and 100 μm. In a preparatory step 16, the ceramic plate 7 comprising the thin copper layer 10 is subsequently arranged on the first upper side 5a of the flat aluminum body 2. In the alternative, at least one ceramic plate 7 can in each case be arranged on the first upper side 5a and on the second upper side 5b of the flat aluminum body 2. In a joining step 17, the joining side 6 of the respective ceramic plate 7 is then connected to the respective upper side 5a and/or 5b of the aluminum body 2 by means of a substance-to-substance bond by supplying heat. After the joining step 17, the power electronics 8 can subsequently be arranged on the electrics side 9 of the ceramic plate 7, for example by means of a soft soldering thus by means of a soldering at a temperature of below 450° C. in a production step 18.

In the preparatory step 16, a solder coating for example an aluminum solder coating and/or a silicon solder coating and/or a copper solder coating and/or a nickel solder coating and/or a flux can be applied onto the respective upper side 5a or 5b of the aluminum body 2 and/or onto the respective joining side 6 of the ceramic plate 7. In the joining step, the ceramic plate 7 can then be connected to the aluminum body 2 by means of a substance-to-substance bond by means of a direct soldering.

In the alternative, a sinter coating can be applied onto the respective upper side 5a or 5b of the aluminum body 2 and/or onto the respective joining side 6 of the ceramic plate 7 at least area by area in the preparatory step 16. The sinter coating is preferably an aluminum sinter coating and/or a silicon sinter coating and/or a copper sinter coating and/or a nickel sinter coating. In the joining step 17, the ceramic plate 7 can subsequently be arranged on the aluminum body 2 by means of a substance-to-substance bond by means of a sintering.

The joining step 17 can be performed at a temperature of between 200° C. and 600° C. The heat supply can also occur by means of an exothermic joining coating for example a joining film. If the joining step 17 is performed at a temperature of above 450° C. and if the aluminum body 2 is embodied in the form of an aluminum tube 3, the rib structure 4 can also be arranged in the aluminum tube 3 by means of a hard soldering in the joining step 17. For this purpose, a solder coating can be applied in the aluminum tube 3 in the preparatory step 16, so that a direct soldering of the rib structure 4 to the aluminum tube 3 becomes possible.

The ceramic plate 7 can be arranged on the aluminum body 2 in a time-saving and effort-reduced manner by means of a substance-to-substance bond by means of the method 14 according to the invention. The production costs of the cooling device 1 as well as of the cooling arrangement 12 can thus be reduced significantly.

The invention claimed is:

1. A method for producing a cooling device for cooling a power electronics, comprising:
   a) applying a thin copper layer at least area by area directly onto a respective joining side of at least two ceramic plates;
   b) arranging the at least two ceramic plates with the respective thin copper layer on at least one of a first upper side of a flat aluminum body and a second upper side of the aluminum body, which is disposed opposite the first upper side, such that (i) the at least two ceramic plates are arranged opposite one another and offset from one another on the aluminum body and (ii) the respective copper layer is disposed directly between the respective ceramic plate and the aluminum body;

c) forming a substance-to-substance bond between the respective joining side of each of the at least two ceramic plates and the aluminum body when the at least two ceramic plates are arranged offset relative to one another via supplying heat;

wherein step c) includes arranging a rib structure within the aluminum body and coupling the rib structure and the aluminum body together via forming a substance-to-substance bond; and wherein coupling the rib structure and the aluminum body together is performed simultaneously with forming the substance-to-substance bond between the at least two ceramic plates and the aluminum body.

2. The method according to claim 1, wherein:

step b) includes applying a solder coating onto at least one of the first upper side, the second upper side, and the respective joining side of at least one of the at least two ceramic plates at least area by area; and forming the substance-to-substance bond via heat in step c) includes soldering.

3. The method according to claim 2, wherein step b) further includes arranging a flux on at least one of the first upper side, the second upper side, and the respective joining side of at least one of the at least two ceramic plates at least area by area.

4. The method according to claim 1, wherein:

step b) includes applying at least one of an aluminum sinter coating, a silicon sinter coating, a copper sinter coating, and a nickel sinter coating onto at least one of the first upper side, the second upper side, and the respective joining side of at least one of the at least two ceramic plates at least area by area; and forming the substance-to-substance bond via heat in step c) includes sintering.

5. The method according to claim 1, wherein:

step b) includes arranging an exothermic joining coating on at least one of the first upper side, the second upper side, and the respective joining side of at least one of the at least two ceramic plates at least area by area; and forming the substance-to-substance bond via heat in step c) includes exothermic soldering.

6. The method according to claim 1, wherein forming the substance-to-substance bond via heat in step c) includes forming the bond at a temperature from 200° C. to 600° C.

7. The method according to claim 1, further comprising:

clamping the aluminum body to the at least two ceramic plates prior to step c); and restricting thermal distortion of the aluminum body during step c) via the clamping of the aluminum body to the at least two ceramic plates.

8. The method according to claim 1, wherein:

the aluminum body is a flat aluminum tube; and step b) includes applying a solder coating onto a plurality of inner sides of the aluminum tube.

9. The method according to claim 1, further comprising:

d) arranging a power electronics on a respective electronics side of the at least two ceramic plates disposed opposite the respective joining side, the respective electronics side including a copper structure, and coupling the power electronics to the respective electronics side via a substance-to-substance bond; and wherein step d) occurs after step c).

10. The method according to claim 9, wherein:

the copper structure is configured as a copper conductor track structure; and arranging the power electronics on the respective electronics side includes arranging the power electronics on the copper conductor track structure.

11. The method according to claim 1, wherein:

the at least two ceramic plates each have an electronics side, the respective joining side and the respective electronics side facing opposing directions;

step a) includes applying a second thin copper layer directly onto the respective electronics side of the at least two ceramic plates; and step a) further includes simultaneously applying the copper layer on the respective joining side and the second copper layer on the respective electronics side.

12. The method according to claim 1, wherein step a) includes covering at least a portion of the respective joining side with the copper layer and subsequently structuring the copper layer via abrasion such that the copper layer covers the portion of the respective joining side area by area.

13. The method according to claim 1, further comprising, prior to step a), roughening the respective joining side of the at least two ceramic plates via at least one of laser ablation and a wet-chemical processes, and wherein the copper layer is applied in step a) via thermal spraying.

14. The method according to claim 1, wherein the copper layer is sandwiched between and directly abuts the respective ceramic plate and the aluminum body.

15. The method according to claim 1, wherein:

the at least two ceramic plates includes a first ceramic plate and a second ceramic plate; and the first ceramic plate, the copper layer of the first ceramic plate, the aluminum body, the copper layer of the second ceramic plate, and the second ceramic plate are arranged, in this order, directly following one after another.

16. A method for producing a cooling device for cooling a power electronics, comprising:

applying a thin copper layer at least area by area directly onto a respective joining side of at least two ceramic plates, the copper layer having a thickness of 20 µm to 200 µm;

arranging the at least two ceramic plates on a flat aluminum body offset relative to one another such that (i) the respective thin copper layer abuts one of a first upper side of the aluminum body and a second upper side of the aluminum body, which is disposed opposite the first upper side, and (ii) the at least two ceramic plates are arranged opposite one another on the aluminum body;

connecting the at least two ceramic plates directly to the aluminum body when the at least two ceramic plates are arranged offset relative to one another via supplying heat to form a substance-to-substance bond between the respective copper layer of each of the at least two ceramic plates and the aluminum body;

arranging a rib structure within the aluminum body and coupling the rib structure and the aluminum body together via forming a substance-to-substance bond; and wherein coupling the rib structure and the aluminum body together is performed simultaneously with forming the substance-to-substance bond between the at least two ceramic plates and the aluminum body.

17. A method for producing a cooling device for cooling a power electronics, comprising:
applying a first thin copper layer at least area by area onto a joining side of a first ceramic plate;
applying a second thin copper layer at least area by area onto a joining side of a second ceramic plate;
arranging (i) the first ceramic plate on a first upper side of a flat aluminum body
and (ii) the second ceramic plate on a second upper side of the flat aluminum body,
the second upper side of the aluminum body disposed opposite the first upper side,
such that the first ceramic plate, the first copper layer, the aluminum body, the second copper layer, and the second ceramic plate are stacked on one another in this order
and the first ceramic plate and the second ceramic plate are offset from one another;
forming a substance-to-substance bond between the aluminum body and the respective joining side of the first ceramic plate and the second ceramic plate when the first ceramic plate and the second ceramic plate are arranged offset relative to one another via supplying heat;
arranging a rib structure within the aluminum body and coupling the rib structure and the aluminum body together via forming a substance-to-substance bond; and
wherein coupling the rib structure and the aluminum body together is performed simultaneously with forming the substance-to-substance bond between the aluminum body and the respective joining side of the first ceramic plate and the second ceramic plate.

* * * * *